United States Patent
Douts et al.

(10) Patent No.: US 6,653,895 B1
(45) Date of Patent: Nov. 25, 2003

(54) GAIN-BOOST NULLING AMPLIFIER FOR AUTO-ZERO CIRCUIT

(75) Inventors: Benjamin A. Douts, Tucson, AZ (US); Thomas L. Botker, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 59 days.

(21) Appl. No.: 10/167,867

(22) Filed: Jun. 12, 2002

(51) Int. Cl.[7] .............................. H03F 1/02; H03F 3/45; H03L 5/00; H03K 17/00
(52) U.S. Cl. .............................. 330/9; 330/69; 327/307; 327/124
(58) Field of Search .................. 330/9, 69; 327/124, 327/307

(56) References Cited

U.S. PATENT DOCUMENTS 5,027,116 A * 6/1991 Armstrong et al. ............ 330/9
5,124,663 A * 6/1992 McEntarfer et al. ........... 330/9
6,140,872 A * 10/2000 McEldowney ................. 330/9

* cited by examiner

Primary Examiner—Patricia T. Nguyen
(74) Attorney, Agent, or Firm—W. Daniel Swayze, Jr.; W. James Brady; Frederick J. Telecky, Jr.

(57) ABSTRACT

A nulling amplifier (52A) for an auto-zeroed amplifier includes a first differential stage including first (3) and second (16) input transistors and a second differential stage including first (18) and second (19) nulling transistors coupled to drains of the second and first input transistors and to a folded cascode circuit (48) coupled to an output stage (59). A gain boost circuit increases the output impedance of the nulling amplifier. The gm ratios of the first and second input transistors and the first and second nulling transistors have values which establish a predetermined low input-referred noise level in the nulling amplifier, and the gain boost circuit maintains a low offset voltage.

26 Claims, 6 Drawing Sheets

US 6,653,895 B1

GAIN-BOOST NULLING AMPLIFIER FOR AUTO-ZERO CIRCUIT

BACKGROUND OF THE INVENTION

The invention relates to a method and circuit for reducing noise and charge injection errors and improving DC precision in auto-zeroed circuits.

In nulling amplifiers of auto-zero circuits such as the one shown in FIGS. 1A and 1B, low input-referred noise is achieved by maximizing the transconductance (gm) ratio of a pair of main input transistors to that of a pair of nulling transistors. The gm of the pair of main input transistors is limited by their physical size and by current consumption limitations of the auto-zero circuit and the nulling amplifier thereof. The gm ratio of the pair of main input transistors to that of the nulling pair of transistors may be maximized by decreasing the gm of the nulling pair, but if the gm of the nulling pair is decreased too much, the DC precision of the nulling amplifier and the DC precision of the auto-zeroed amplifier circuit is worsened by gain error effects in the nulling amplifier. In the past, certain limitations of the ratio of the gm of the pair of main input transistors pair to the gm of the nulling pair of transistors for auto-zeroed amplifiers have been accepted as a fundamental design constraint. Specifically, because of constraints on the quiescent current consumption of integrated circuit chips containing auto-zeroed amplifiers, it has been commonly accepted that the ratio of the gm of the pair of main input transistors to the gm of the nulling pair of transistors should be roughly 10. It has been commonly accepted that a larger ratio would result in unacceptably large chip size and power consumption.

Thus, there is an unmet need for an improved way of reducing the input-referred noise of the nulling amplifier of an auto-zeroed amplifier circuit. There also is an unmet need for an improved way of reducing the input-referred noise of the nulling amplifier of an auto-zeroed amplifier circuit while maintaining a low input offset voltage of the nulling amplifier.

There also is an unmet need for an improved way of reducing the input-referred noise of the nulling amplifier of an auto-zeroed amplifier circuit without substantially increasing quiescent current consumption, and/or cost of the auto-zeroed amplifier circuit while maintaining a low input offset voltage of the nulling amplifier.

SUMMARY OF THE INVENTION

Accordingly, it is an object of the invention to provide an improved way of reducing the input-referred noise of the nulling amplifier of an auto-zeroed amplifier circuit.

It is another object of the invention to provide an improved way of reducing the input-referred noise of the nulling amplifier of an auto-zeroed amplifier circuit while maintaining a low value of the corrected input offset voltage of the nulling amplifier.

It is another object of the invention to provide an improved way of reducing the input-referred noise of the nulling amplifier of an auto-zeroed amplifier circuit without substantially increasing power dissipation, size, and/or cost of the auto-zeroed amplifier circuit while maintaining a low input offset voltage of the nulling amplifier.

Briefly described, and in accordance with one embodiment thereof, the invention provides a nulling amplifier (52A) for an auto-zeroed amplifier that includes a first differential stage including first (3) and second (16) input transistors and a second differential stage including first (18) and second (19) nulling transistors coupled to drains of the first and second input transistors and to a folded cascode circuit (48) coupled to an output stage (59). A gain boost circuit controls the output resistance of the auto-zeroed amplifier. The gm ratios of the first and second input transistors and the first and second nulling transistors have values which establish a predetermined low input-referred noise level in the nulling amplifier, and the gain boost circuit provides high gain resulting in low gain error and thereby allows the offset voltage of the nulling amplifier to be reduced.

In the described embodiment, a nulling amplifier (52A) includes a first differential stage including first (3) and second (16) input transistors and a first tail current source (38) coupled to sources of the first and second input transistors. A switching circuit (50) selectively couples a gate of the second input transistor (16) to either a first input signal ($V_{in+}$) or to a gate of the first input transistor (3) in response to a control signal ($\phi$), a second input signal ($V_{in-}$) being coupled to the gate of the first input transistor. The second differential stage includes first (18) and second (19) nulling transistors, a second tail current source (39) being coupled to sources of the first and second nulling transistors, a drain of the first nulling transistor being coupled to the drain of the second input transistor, a drain of the second nulling transistor being coupled to the drain of the first input transistor. A first hold capacitor (C3) is coupled between a gate of the first nulling transistor and a first reference voltage, and a second hold capacitor (C4) is coupled between a gate of the second nulling transistor and the first reference voltage. First (69A) and second (69B) switches couple the gates of the first and second nulling transistors to receive first ($V_{out-}$) and second ($V_{out+}$) output signals coupled to an output stage (59) in response to the control signal ($\phi$).

A folded cascode circuit (48) has an input coupled to the drains of the first (3) and second (16) input transistors and an output coupled to the input of the output stage (59). The folded cascode circuit (48) includes a first low side constant current source transistor (7) having a drain coupled to the drain of the second input transistor (16) and to a source of a first cascode transistor (8), and a second low side constant current source transistor (41) having a drain coupled to the drain of the first input transistor (3) and to a source of a second cascode transistor (9). The gain boost amplifier circuitry (113,117) includes a low side gain boost amplifier (113) including a first gain boost amplifier output transistor (11) coupling the drain of the first low side constant current source transistor (7) to the source of the first cascode transistor (8) and a second gain boost amplifier output transistor (10) coupling the drain of the second low side constant current source transistor (41) to the source of the second cascode transistor (9).

The folded cascode circuit (48) also includes a first high side constant current source transistor (4) having a drain coupled to the drain of the first cascode transistor (8), and a second high side constant current source transistor (20) having a drain coupled to the drain of the second cascode transistor (9).

The gain boost amplifier circuitry (113,117) also includes a high side gain boost amplifier (117) including a third gain boost amplifier output transistor (1) coupling the drain of the first high side constant current source transistor (4) to the drain of the first cascode transistor (8) and a fourth gain boost amplifier output transistor (2) coupling the drain of the second high side constant current source transistor (20) to the drain of the second cascode transistor (9).

The low side gain boost amplifier (113) includes a first feedback input (FBI) coupled to the drain of the first low side constant current source transistor (7) and a second feedback input (FB2) coupled to the drain of the second low side constant current source transistor (41). The high side gain boost amplifier (117) includes a first feedback input (FB1) coupled to the drain of the second high side constant current source transistor (20) and a second feedback input (FB2) coupled to the drain of the first high side constant current source transistor (4).

A common mode feedback circuit (47) is coupled to the first and second switches and the first (4) and second (20) high side constant current source transistors to produce a common mode level of the first ($V_{out-}$) and second ($V_{out+}$) output signals.

DETAILED DESCRIPTION OF THE PREFERRED EMBODIMENTS

Figure 1A:
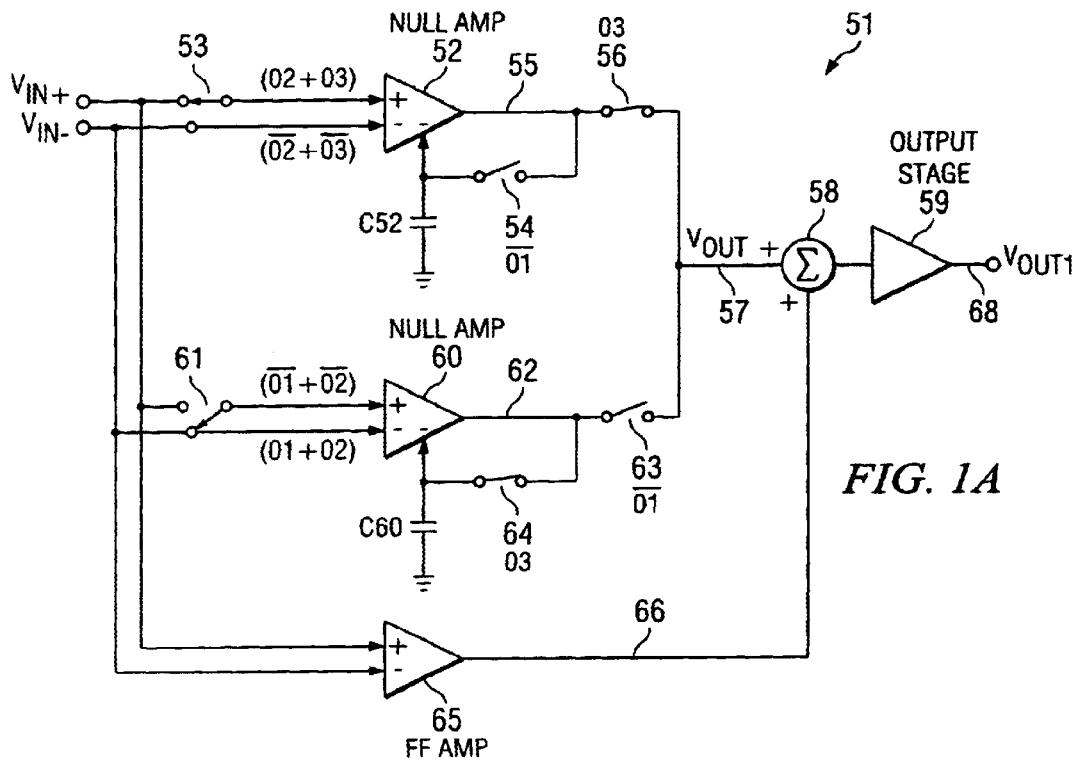
FIGS. 1A and 1B are block diagrams of two operating configurations of the same conventional auto-zeroed amplifier circuit.
Figure 1B:
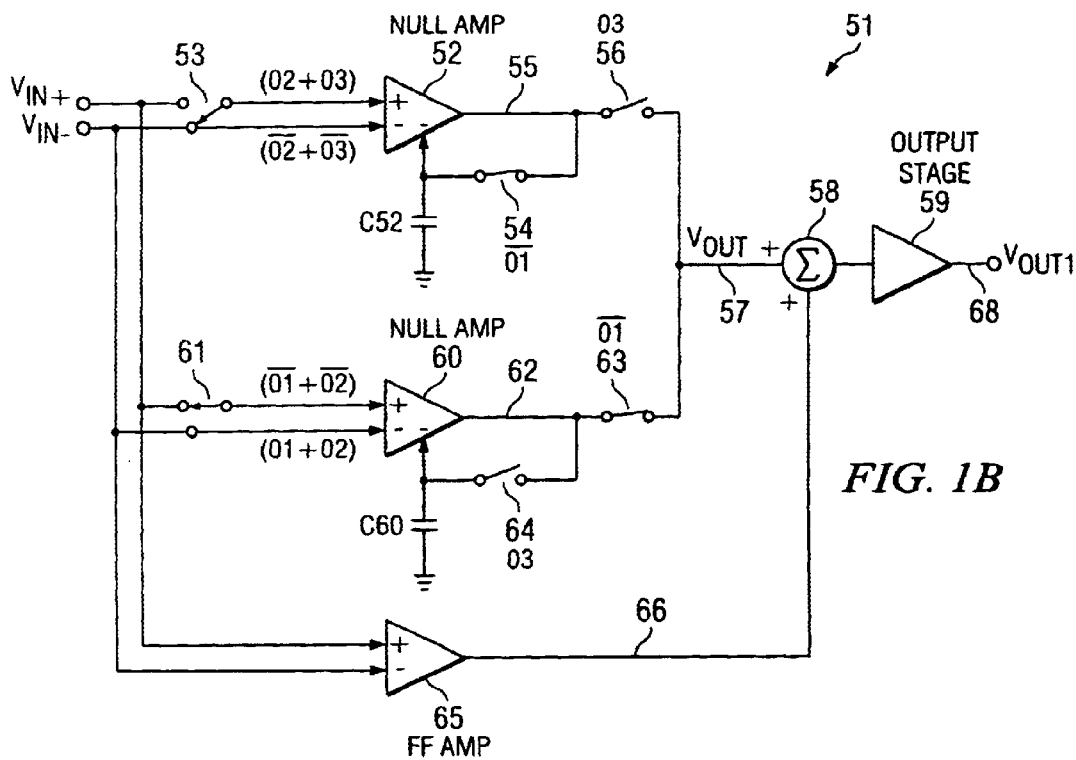

Referring to FIGS. 1A and 1B, auto-zeroed amplifier 51 includes two nulling amplifiers 52 and 60, a feed-forward amplifier 65, an analog summing circuit 58, and an output stage 59. A differential input voltage $V_{in}=V_{in+}-V_{in-}$ is selectively applied between the (+) and (−) inputs of nulling amplifiers 52 and 60 and feed-forward amplifier 65. The (+) input of nulling amplifier 52 is connected by a single pole, double throw switch 53 to either Vin+ or the (−) input of nulling amplifier 52. Similarly, the (+) input of nulling amplifier 60 is connected by a single pole, double throw switch 61 to either Vin+ or the (−) input of nulling amplifier 60. Output stage 59 may include summing circuit 58.

Figure 6:
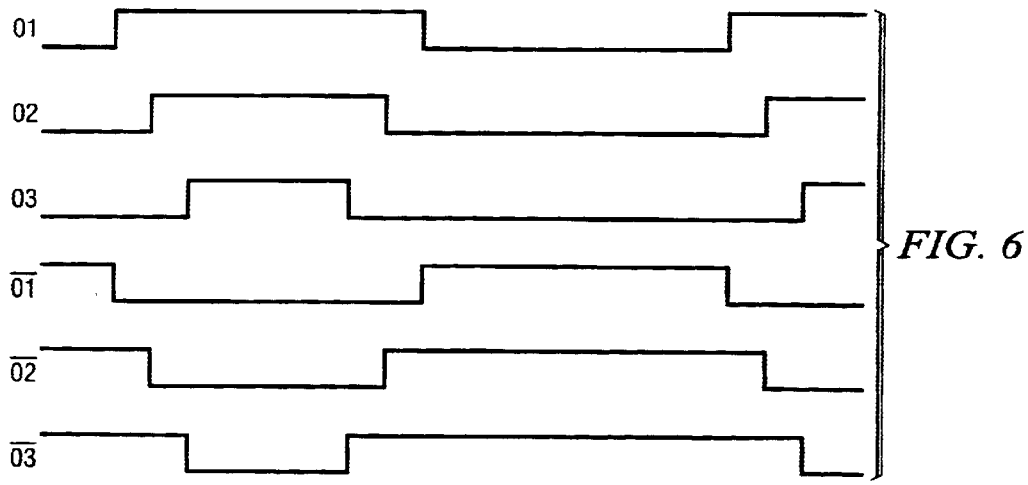
FIG. 6 is a timing diagram useful in describing the operation of the circuitry of FIGS. 1A, 1B, and 2-4.

Switch 53 is connected to $V_{in+}$ such that the input voltage $V_{in}$ is applied between the (+) and (−) inputs of nulling amplifier 52 when φ2 and φ3 are both high. Switch 53 short-circuits the (+) and (−) inputs of nulling amplifier 52 when φ2 and φ3 are both low. The output of nulling amplifier 52 is connected by conductor 55 to one terminal of a switch 56 and to one terminal of a switch 54. The other terminal of switch 54 is connected to an additional (−) input of nulling amplifier 52 and to one terminal of a hold capacitor C52. The other terminal of switch 56 is connected by conductor 57 to a first input of analog summing circuitry 58. Switch 54 connects hold capacitor C52 and the additional (−) input of nulling amplifier 52 to conductor 55 only when φ1 is low. Switch 56 connects conductor 55 to conductor 57 only when φ3 is high. The waveforms of φ1, φ2, and φ3 and their logical complements are shown in FIG. 6.

Similarly, switch 61 is connected to $V_{in+}$ such that the input voltage $V_{in}$ is applied between the (+) and (−) inputs of nulling amplifier 60 when φ1 and φ2 are both low. Switch 61 short-circuits the (+) and (−) inputs of nulling amplifier 60 when φ1 and φ2 are both high. The output of nulling amplifier 60 is connected by conductor 62 to one terminal of a switch 63 and to one terminal of a switch 64. The other terminal of switch 64 is connected to an additional (−) input of nulling amplifier 60 and to one terminal of a hold capacitor C60. The other terminal of switch 63 is connected by conductor 57 to the first input of analog summing circuitry 58. Switch 64 connects hold capacitor C60 and the additional (−) input of nulling amplifier 60 to conductor 62 only when φ3 is high. Switch 63 connects conductor 62 to conductor 57 only when φ1 is low.

A second input of analog summing circuit 58 is connected to the output 66 of feed-forward amplifier 65. Thus, the output of nulling amplifier 52 or nulling amplifier 60 and the output of feed-forward amplifier 65 are summed by a summing circuit 58, which functions as an input circuit of output stage 59 of auto-zeroed amplifier 51 to produce an output voltage $V_{out1}$ on conductor 68.

FIG. 1A shows auto-zeroed amplifier 51 with switch 53 connecting the (+) input of nulling amplifier 52 to $V_{in+}$, switch 56 closed, and switch 54 open, so that $V_{in}$ is applied between the (+) and (−) inputs of nulling amplifier 52. Therefore, $V_{in}$ is amplified by the gain of nulling amplifier 52 and applied by conductor 57 to the first input of summing circuit 58. The voltage being held on capacitor C52 compensates for the input offset voltage of nulling amplifier 52. Also, switch 61 short-circuits the (+) and (−) inputs of nulling amplifier 60, switch 64 is closed, and switch 63 is open. This causes a correction voltage to be stored on capacitor C60, which in effect cancels the offset voltage of nulling amplifier 60. $V_{in}$ also is amplified by the gain of feed-forward amplifier 65 and applied to the second input of summing circuit 58. The output of summing circuit 58 is amplified by output stage 59 to produce $V_{out1}$ on conductor 68. As a practical matter, summing circuit 58 is incorporated in the input circuitry of output stage 59 in a conventional manner, as shown in subsequently described FIG. 5.

Similarly, FIG. 1B shows auto-zeroed amplifier 51 with switch 61 connecting the (+) input of nulling amplifier 60 to $V_{in+}$, switch 63 closed, and switch 64 open, so that $V_{in}$ is applied between the (+) and (−) inputs of nulling amplifier 60. Therefore, $V_{in}$ is amplified by the gain of nulling amplifier 60 and applied by conductor 57 to the first input of summing circuit 58. The voltage being held on capacitor C60 compensates for the input offset voltage of nulling amplifier 60. Also, switch 53 short-circuits the (+) and (−) inputs of nulling amplifier 52, switch 54 is closed, and switch 56 is open. This causes another correction voltage to be stored on capacitor C52, which in effect cancels the offset voltage of nulling amplifier 52. $V_{in}$ is also amplified by the gain of feed-forward amplifier 65 and applied to the second input of summing circuit 58. The output of summing circuit 58 is amplified by output stage 59 to produce $V_{out1}$ on conductor 68.

Thus, nulling amplifiers 52 and 60, one at a time, amplify $V_{in}$ and compensate it for the input offset voltage of one nulling amplifier while the other nulling amplifier samples and stores an updated value of the appropriate correction voltage. Also, $V_{in}$ is constantly amplified by feed-forward amplifier 65 and applied to the second input of summing circuit 58 in order to provide a "continuous-time" path from $V_{in}$ to $V_{out1}$ despite the switching of nulling amplifiers 52 and 60 and also to provide overall stability of the auto-zero amplifier 51. The DC gain of each of nulling amplifiers 52 and 60 is much greater than the DC gain of feed-forward amplifier 65.

It should be understood that the various signals, for example, the signal $V_{out}$ on conductor 57 and the signal $V_{out1}$ on conductor 68, can be differential signals. For example, the differential signal $V_{out}$ can be $V_{out}=V_{out+}-V_{out-}$ where $V_{out+}$ and $V_{out-}$ are as indicated in subsequently described FIGS. 2-1 and 2-2. As another example, the signal on the nulling input terminal, i.e., the (−) input terminal, of nulling amplifier 52 can be considered to be a single-ended representation of the differential voltage between the gates of transistors 18 and 19 in FIG. 2-1.

Figures 1, 2:
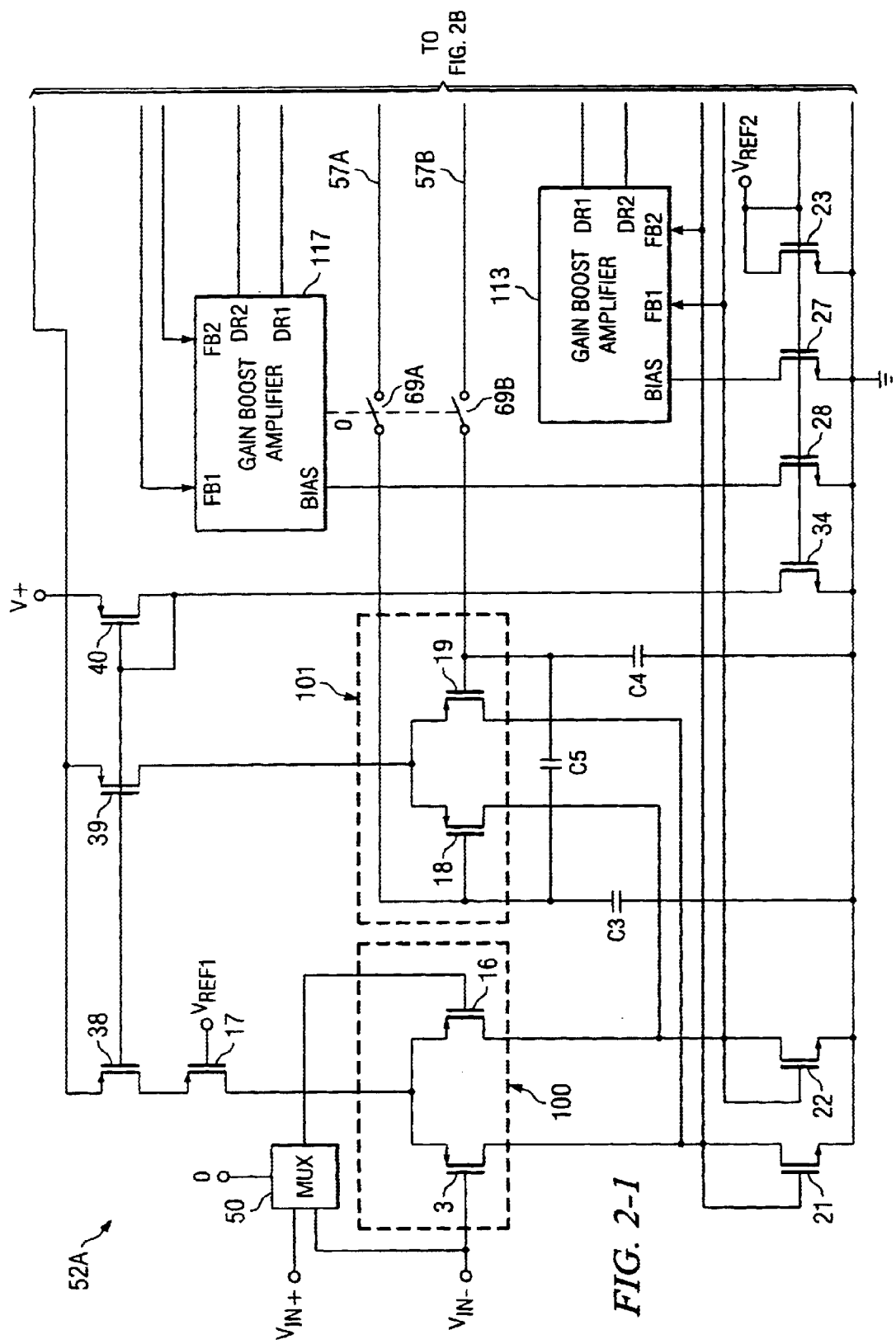
FIGS. 2-1 and 2-2 constitute a schematic diagram of one of the nulling amplifiers included in FIG. 1.
Figure 2:
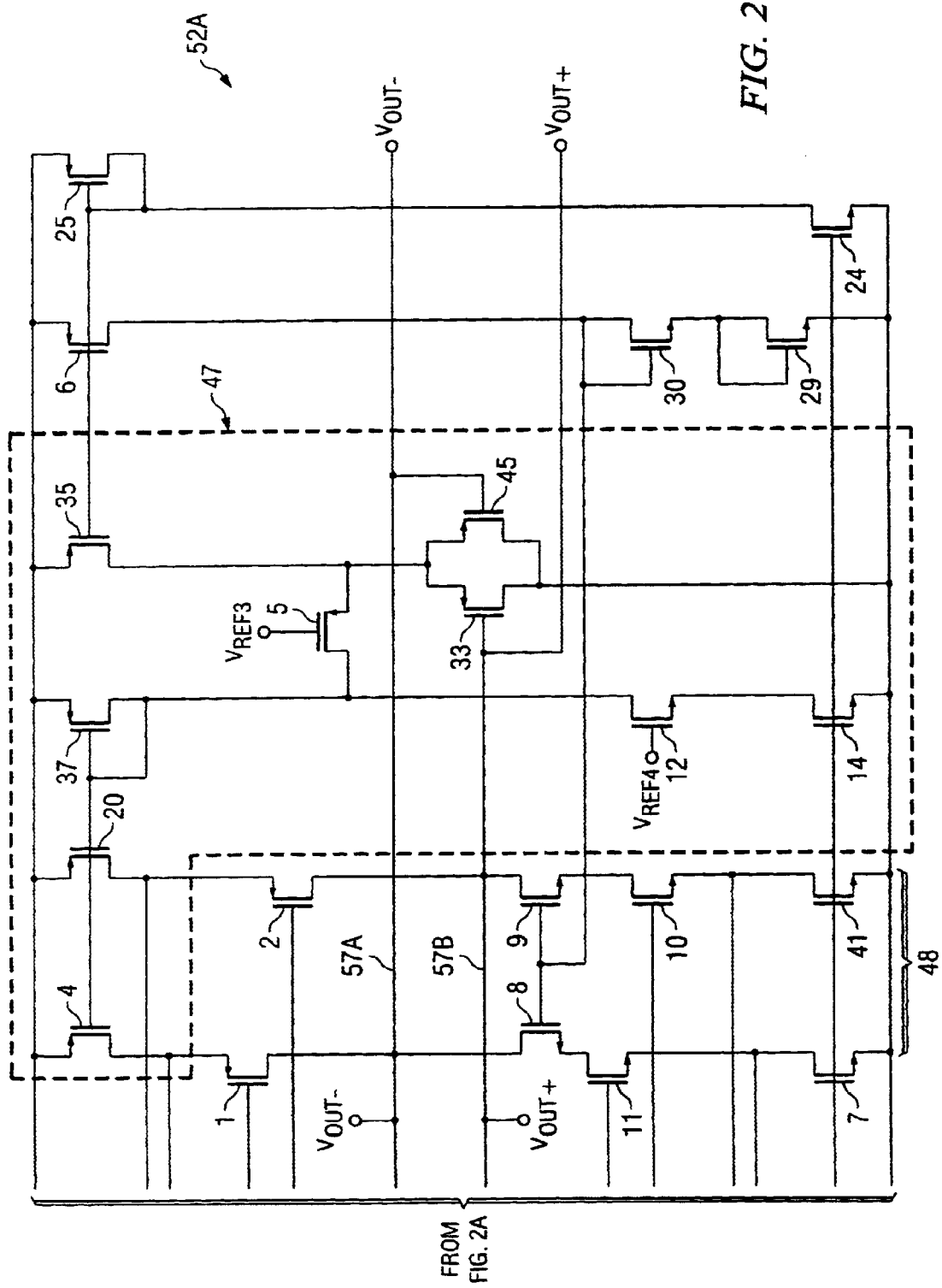

FIGS. 2-1 and 2-2 show a detailed schematic diagram of an improved nulling amplifier 52A which can be used in place of each of nulling amplifiers 52 and 60 in FIG. 1. For simplicity, the input switches 53 and 61 in FIG. 1A are represented by multiplexor 50 in FIGS. 2-1 and 2-2, and the clock signals φ1, φ2, and φ3 and their logical complements are as previously described with reference to FIG. 1A, but in FIGS. 2-1 and 2-2 they are collectively represented by φ and $\bar{\phi}$, respectively. Thus, by way of definition, the term "signal φ" as used herein is intended to encompass either a single clock signal, such as φ3, or a group of clock signals, such as φ1 and φ2 in combination as previously described with reference to FIG. 1A; the term "signal $\bar{\phi}$" is intended to be interpreted similarly. For example, nulling amplifier 52A in FIG. 1A is implemented by nulling amplifier 52A of FIGS. 2-1 and 2-2 with φ connected as shown, and nulling amplifier 60 of FIG. 1A is implemented by nulling amplifier 52A with φ replaced by $\bar{\phi}$. In FIG. 2-1, switches 69A and 69B represent either switch 54 or switch 64 in FIG. 1B.

$V_{in+}$ is connected to one input of multiplexer circuit 50, which has a second input connected to $V_{in-}$. Depending on the state of multiplexer input selection signals φ, the gate of P-channel transistor 16 is connected either to $V_{in+}$ or to the gate of P-channel transistor 3. Transistors 3 and 16 constitute a "main differential pair", and may have their drains connected to diode-connected N-channel voltage clamp transistors 21 and 22, respectively, although diode-connected voltage clamp transistors 21 and 22 can be omitted in some cases. The sources of transistors 21 and 22 are to connected ground. The sources of transistors 3 and 16 are connected to the drain of a cascode P-channel transistor 17 having its gate connected to a bias voltage $V_{REF1}$ and having its source connected to the drain of a P-channel current mirror transistor 38. The source of transistor 38 is connected to a supply voltage V+.

The drains of transistors 3 and 16 also are connected to the drains of P-channel transistors 19 and 18, respectively, which constitute a "nulling pair". The gate of transistor 18 is connected to one terminal of a hold capacitor C3 having another terminal connected to ground. The gate of transistor 18 also is connected to one terminal of a switch 69A which is controlled by φ, which represents φ1 for nulling amplifier 52 or φ3 for nulling amplifier 60. The gate of transistor 19 is connected to one terminal of a hold capacitor C4 and to one terminal of a switch 69B which also is controlled by φ. The other terminal of capacitor C4 is connected to ground. Another hold capacitor C5 is connected between the gates of transistors 18 and 19 to increase the total hold capacitor capacitance. The sources of transistors 18 and 19 are connected to the drain of a P-channel current source transistor 39 having its source connected to V+ and its gate connected to the gate of transistor 38 and also to the gate and drain of a P-channel transistor 40 having its source connected to V+. The drain of transistor 40 is connected to the drain of a N-channel current mirror transistor 34 having its source connected to ground and its gate connected to $V_{REF2}$ and to the gates of N-channel current mirror transistors 28, 27, 23, 7, 41, 14 and 24 each having its source connected to ground. The drain of transistor 23 also is connected to $V_{REF2}$.

The other terminal of switch 69A is connected to an output voltage $V_{out-}$ on conductor 57A, and the other terminal of switch 69B is connected to a voltage $V_{out+}$ on conductor 57B, so switch 56 of FIG. 1A and switch 63 of FIG. 1A would be used to selectively couple $V_{out+}$ and $V_{out-}$ of each nulling amplifier to $V_{out}$ of FIG. 1A. $V_{out-}$ is coupled by conductor 57A to the gate of a P-channel transistor 45 having its source connected to the source of a P-channel transistor 5 and to the drain of a P-channel current mirror transistor 35 having its source connected to V+. $V_{out+}$ is coupled by conductor 57B to the gate of a P-channel transistor 33 having its drain connected to ground and to the drain of transistor 45. The source of transistor 33 is connected to the source of transistor 45. The gate of transistor 5 is connected to a reference voltage $V_{REF3}$. The drain of transistor 5 is connected to the drain and gate of a P-channel current mirror transistor 37 having its source connected to V+. The drain of transistor 5 also is connected to the drain of an N-channel cascode transistor 12 having its gate connected to $V_{REF4}$. The source of transistor 12 is connected to the drain of current mirror transistor 14. The gate of transistor 37 is connected to the gates of P-channel current mirror transistors 4 and 20, each of which has its source connected to V+. The drain of current mirror transistor 4 is connected to the feedback input FB2 of a "high side" gain boost amplifier 117 and to the source of a P-channel transistor 1 having its gate connected to the drive output DR2 of gain boost amplifier 117. Similarly, the drain of current mirror transistor 20 is connected to the feedback input FB1 of high side gain boost amplifier 117 and to the source of a P-channel transistor 2 having its gate connected to the drive output DR1 of high side gain boost amplifier 117. Transistors 1 and 2 can be considered to be output transistors or drive transistors of high side gain boost amplifier 117.

The drain of transistor 1 is connected to the drain of an N-channel cascode transistor 8 having its source connected to the drain of an N-channel transistor 11. The gate of transistor 11 is connected to the drive output DR1 of a "low side" gain boost amplifier 113. The source of 20 transistor 11 is connected to a feedback output FB1 of low side gain boost amplifier 113, to the drain of current mirror transistor 7, and to the gate and drain of transistor 22. Similarly, the drain of transistor 2 is connected to the drain of an N-channel cascode transistor 9 having its gate connected to the gate of cascode transistor 8 and its source connected to the drain of an N-channel transistor 10. The gate of transistor 10 is connected to the drive output DR2 of low side gain boost amplifier 113, and the source of transistor 10 is connected to a feedback input FB2 of low side gain boost amplifier 113, to the drain of current mirror transistor 41, and to the gate and drain of transistor 21. The gates of cascode transistors 8 and 9 are connected to the gate and drain of an N-channel transistor 30 having its source connected to the gate and drain of an N-channel transistor 29 having its source connected to ground. The gate and drain of transistor 30 also are connected to the drain of a P-channel current mirror transistor 6 having its gate connected to the gates of P-channel current mirror transistors 35 and 25. The sources of current mirror transistors 35, 6 and 25 are connected to V+. The gate and drain of transistor 25 are connected to the drain of current mirror transistor 24.

In FIGS. 2-1 and 2-2, transistors 7 and 41 are "low side" constant current sources for a folded cascode stage. Transistors 33, 45, 5, 12, 14, 37, 4 and 20 constitute a common mode feedback circuit 47. The drain of transistor 7 is connected to the gate and drain of transistor 22, and the drain of transistor 41 is connected to the gate and drain of transistor 21. The source voltages of transistors 33 and 45 are produced in response to $V_{out+}$ and $V_{out-}$ and are approximately equal to the common mode voltage of signals $V_{out+}$ and $V_{out-}$ plus the average of the $V_{GS}$ voltage of transistors 33 and 45. The source voltage of transistors 33 and 45 controls cascode transistor 5 by changing the current flowing therein. That changes the amount of current required to flow through current mirror transistor 37 in order to satisfy a constant current source represented by current mirror transistor 14. That changes how hard current source transistors 4 and 20 are driven and thereby adjusts the common mode output voltage of $V_{out+}$ and $V_{out-}$ so that it matches $V_{REF3}$.

In accordance with the present invention, variations are produced in the drain voltages of low side constant current source transistors 7 and 41, and these variations are applied to feedback inputs of low side gain boost amplifier 113 and amplified to drive the gate electrodes of transistors 11 and 10, respectively. Corresponding variations also are produced on the drain of high side current mirror transistors 4 and 20, and high side gain boost amplifier 117 is provided to receive the feedback signals from the drains of high side current mirror transistors 4 and 20 and amplify them to drive the gate electrodes of transistors 1 and 2, the drains of which are connected to $V_{out-}$ conductor 57A and $V_{out+}$ conductor 57B, respectively. The amplified $V_{out+}$ and $V_{out-}$ signals are selectively fed back to the gate electrodes of nulling transistors 19 and 18, respectively. The result is an increase in the effective impedances at the circuit nodes 57B and 57A conducting $V_{out+}$ and $V_{out-}$, respectively. Note that the equivalent differential output impedance at $V_{out-}$ conductor 57A and $V_{out+}$ conductor 57B can depend heavily on either one or both of high side gain boost amplifier 117 and low side gain boost amplifier 113.

It should be appreciated that the gm ratio of input transistors 3 and 16 to the gm ratio of nulling transistors 18 and 19 is determined mainly by the physical sizes of those transistors and the amounts of current through them. Increasing the gm ratio by increasing the physical sizes of input transistors 3 and 16 increases the integrated circuit chip size and hence its cost, and also increases the size and cost of the package in which the integrated circuit chip is to be packaged. That in turn increases the amount of printed circuit board area required, and so on. Also, it should be appreciated that increasing of the gm ratio can be accomplished by increasing the tail current for input transistors 3 and 16, but this undesirably increases the power dissipation of the nulling amplifier.

However, in accordance with the present invention, when the gates of transistors 3 and 16 are short-circuited together, switches 69A and 69B are closed, so the output voltage $V_{out}=V_{out+}-V_{out-}$ is fed back to and applied between the gates of nulling input transistors 18 and 19. $V_{out+}$ and $V_{out-}$ are driven fairly close together so that they satisfy the gain from the nulling input transistors 18 and 19 to the output of nulling amplifier 52A in a feedback loop. Therefore, the input offset voltage of the pair of main input transistors 3 and 16 is corrected to a degree that depends on the gain from nulling input transistors 18 and 19 to the output of nulling amplifier 52A.

The following equation represents $V_{out1}$ as a function of the gain $Av1$ of the main differential input stage including input transistors 3 and 16, the offset voltage $Vos1$ of that differential input stage, the gain $Av2$ of the differential nulling stage including nulling transistors 18 and 19, and the offset voltage $Vos2$ of the differential nulling stage. $Av1$ is the open loop gain from the main differential input transistors 3 and 16 to the output of the nulling amplifier, and $Av2$ is the open loop gain from the nulling differential input to the output of the nulling amplifier.

$$Vout1 = \frac{Av1 \times Vos1 + Av2 \times Vos2}{1 + Av2} \quad \text{(Equation 1)}$$

Dividing both sides of Equation 1 by $Av1$ shows the residual offset voltage referred to the input of the differential input stage including transistors 3 and 16.

$$Vos = \frac{Vout1}{Av1} = \frac{Vos1}{1+Av2} + \left(\frac{Av2}{Av1}\right) \times \left(\frac{Vos2}{1+Av2}\right) \quad \text{(Equation 2)}$$

As shown in Equation 2, there is a division factor $(1+Av2)$ in the mathematical expression for the residual offset of nulling amplifier 52A. In order to reduce gain error in the correction of the offset of transistors 3 and 16, the forward gain $Av2$ should be as high as possible. The $Av2/Av1$ ratio is independent of the amount of gain boost, so Equation 2 shows that increasing the open loop gain $Av2$ by adding gain boost lowers the input-referenced offset voltage $V_{OS}=V_{out1}/Av1$. In addition, providing gain boost allows $Av2/Av1$ to be fixed while $Av2$ is increased. Lowering $Av2/Av1$ and increasing $Av2$ results in a lower $V_{OS}=V_{out1}/Av1$ of the nulling amplifier.

The gain from nulling transistors 18 and 19 to the output $V_{out+}-V_{out-}$ between conductors 57B and 57A of nulling amplifier 52A is dependent on the gm of nulling of transistors 18 and 19. However, to obtain good noise performance and low input offset voltage, the gm of nulling transistors 18 and 19 should be very low. The gain from nulling transistors 18 and 19 to the output $V_{out+}-V_{out-}$ is proportional to the gm of nulling transistors 18 and 19. As the gm of nulling transistors 18 and 19 is reduced, the amount of residual error shown by Equation 2 also is increased. The gain from nulling transistors 18 and 19 to the output $V_{out}=V_{out+}-V_{out-}$ also is proportional to the output resistance of the cascode section 48 of nulling amplifier 52A. The gain boost circuitry functions by increasing the output resistance and therefore helps to increase the gain of the nulling amplifiers.

The above equations refer to the residual offset of the nulling amplifiers. The following equations describe the overall offset of the auto-zeroed amplifier and show the effect of the offset of the nulling amplifiers on the overall offset of the auto-zeroed amplifier.

For $V_{in}=0$, i.e., with the (+) and (−) inputs of the one of the nulling amplifiers 52 or 60 which is operatively connected to summing circuit 58 short circuited together, the output voltage of the auto-zeroed amplifier 51 of FIG. 1A is given by $$Vout1 = Avn \times Vosn + Avf \times Vosf, \quad \text{(Equation 3)}$$

where
- $Avn$ is the open loop gain from the input of the nulling amplifier to the output of the entire auto-zeroed amplifier,
- $Vosn$ is the residual input offset voltage of whichever one of nulling amplifiers 52 and 60 is operatively connected to summing circuit 58,
- $Avf$ is the open loop gain from the input of feed-forward amplifier 65 to the output of the entire auto-zeroed amplifier, and
- $Vosf$ is the input offset voltage of feed-forward amplifier 65.

The referring of this output voltage to the input of the auto-zeroed amplifier 51 is represented by $$Vos = \frac{Vout1}{Avn + Avf} = Vosn\frac{Avn}{Avn + Avf} + Vosf\frac{Avf}{Avn + Avf}. \quad \text{(Equation 4)}$$

However, auto-zeroed amplifier 51 is designed so that Avn is much greater than Avf. Therefore, the input-referred offset voltage of auto-zeroed amplifier 51 is represented by $$Vos \approx Vosn + Vosf\frac{Avf}{Avn} \approx Vosn. \quad \text{(Equation 5)}$$

Thus, the offset voltage of auto-zeroed amplifier 51 is dominated by the offset voltages of nulling amplifiers 52 and 60.

In accordance with the present invention, providing the high side gain boost amplifier 117 and the low side gain boost amplifier 113 connected as shown in FIGS. 2-1 and 2-2 increases the equivalent output resistance at circuit nodes 57A and 57B so that the product of gm multiplied by the equivalent output resistance is high even though the gm of nulling transistors 18 and 19 is reduced as much as possible to minimize noise referred to the input. Consequently, the amount of gain error in the feedback loop is minimized so that the offset voltage remains low.

Figure 3:
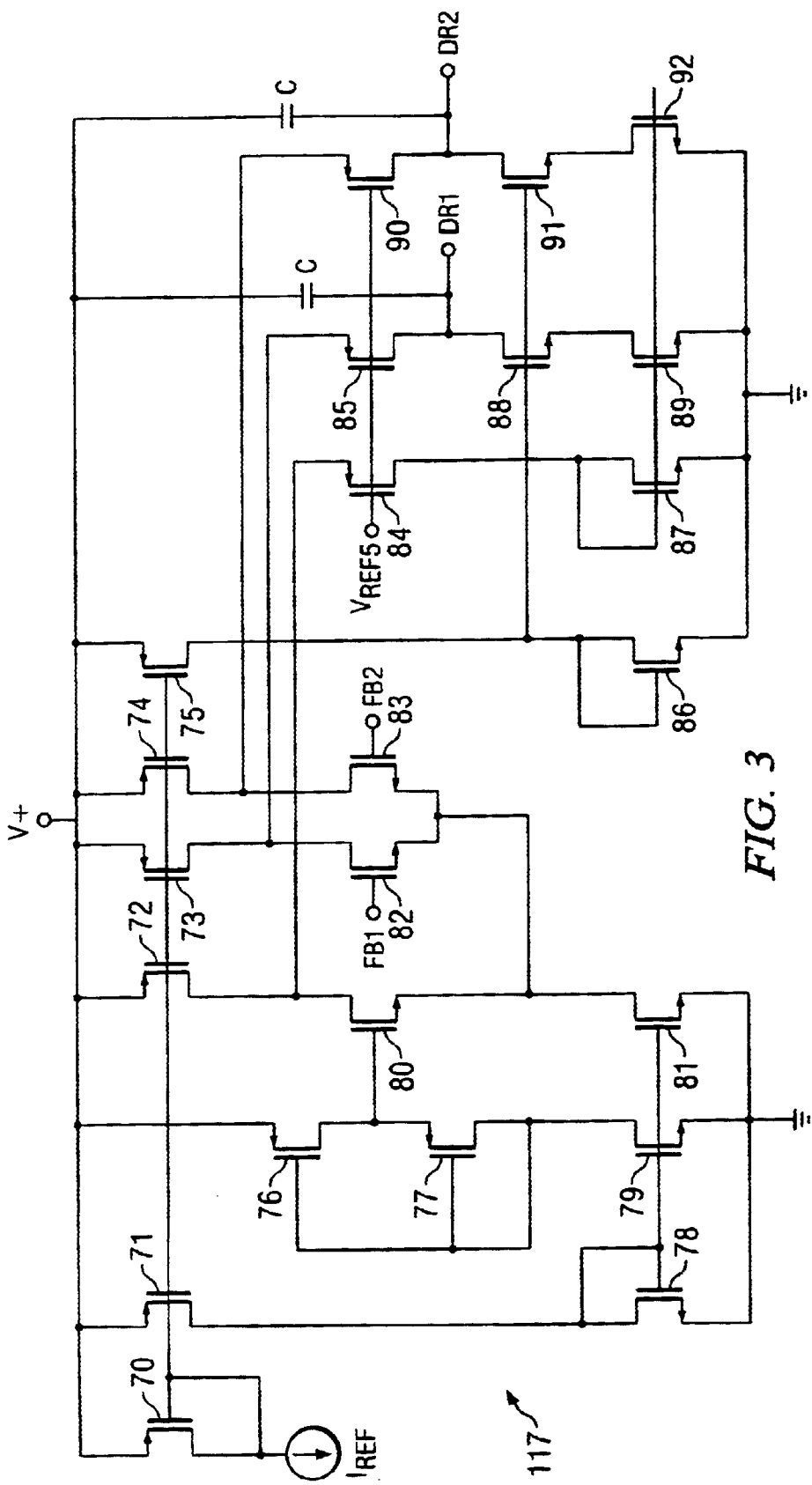
FIG. 3 is a schematic diagram of the high side gain boost amplifier 117 of FIG. 2-1.

Referring to FIG. 3, "high side" gain boost amplifier 117 includes two amplifier stages connected to establish the source voltage of both transistors 1 and 2 in FIGS. 2-1 and 2-2 and compare those source voltages to a reference voltage that is internally derived within gain boost amplifier 117. The gates of N-channel transistors 82 and 83 of the first stage are connected to the feedback terminals FB1 and FB2 of high side gain boost amplifier 117. Transistors 82 and 83 are connected differentially with respect to a reference voltage established on the gate of N-channel transistor 80 by a reference current source $I_{REF}$ and circuitry including transistors 70, 71, 76, 77, 78 and 79. Feedback from the sources of transistors 1 and 2 (see FIGS. 2-1 and 2-2) establishes the voltages on terminals FB2 and FB1, respectively, and forces them to be nearly equal to the reference voltage established on the gate of transistor 80. The currents through the drains of transistors 82 and 83 modulate the currents that are routed to flow through P-channel cascode transistors 85 and 90. The gates of cascode transistors 85 and 90 are connected to receive a reference voltage $V_{REF5}$. The drains of cascode transistors 85 and 90 are connected to the DR1 and DR2 terminals, respectively, of high side gain boost amplifier 117.

The differences between the drains currents of transistors 80, 82, and 83 and the drain currents of transistors 72, 73 and 74, respectively, are folded into cascode transistors 84, 85 and 90, which produce the high output impedance/resistance of the output of the folded cascode stage. Current source transistors 87, 89 and 92 provide loads for cascode transistors 84, 85 and 90, respectively. The current drive into transistor 87 of gain boost amplifier 117 is mirrored to the current in transistors 89 and 92 in order to establish the voltages on terminals DR1 and DR2, which drive transistors 1 and 2 of FIG. 2-1. Since transistors 1 and 2 of FIG. 2-1 have relatively constant drain currents, the voltages of their sources follow their drain voltages. Therefore, as the source voltages of transistors 1 and 2 move in response to the signals on terminals DR1 and DR2 of gain boost amplifier 117, the source voltages of transistors 1 and 2 provide feedback to the FB1 and FB2 terminals of gain boost amplifier 117. Since the feedback terminals FB1 and FB2 are connected to the gates of transistors 82 and 83, respectively, the voltages of the gates of transistors 82 and 83 are forced by the feedback to be equal the reference voltage established on the gate of transistor 80, which is set at a specified voltage below V+. Additionally, as the voltages of the gates of transistors 82 and 83 move with respect to one another, they force the voltages of terminals DR1 and DR2 to move so as to keep the voltages of terminals FB1 and FB2 nearly equal. This function provides high differential output impedance of $V_{out+}$ conductor 57B and $V_{out-}$ conductor 57A.

Figure 4:
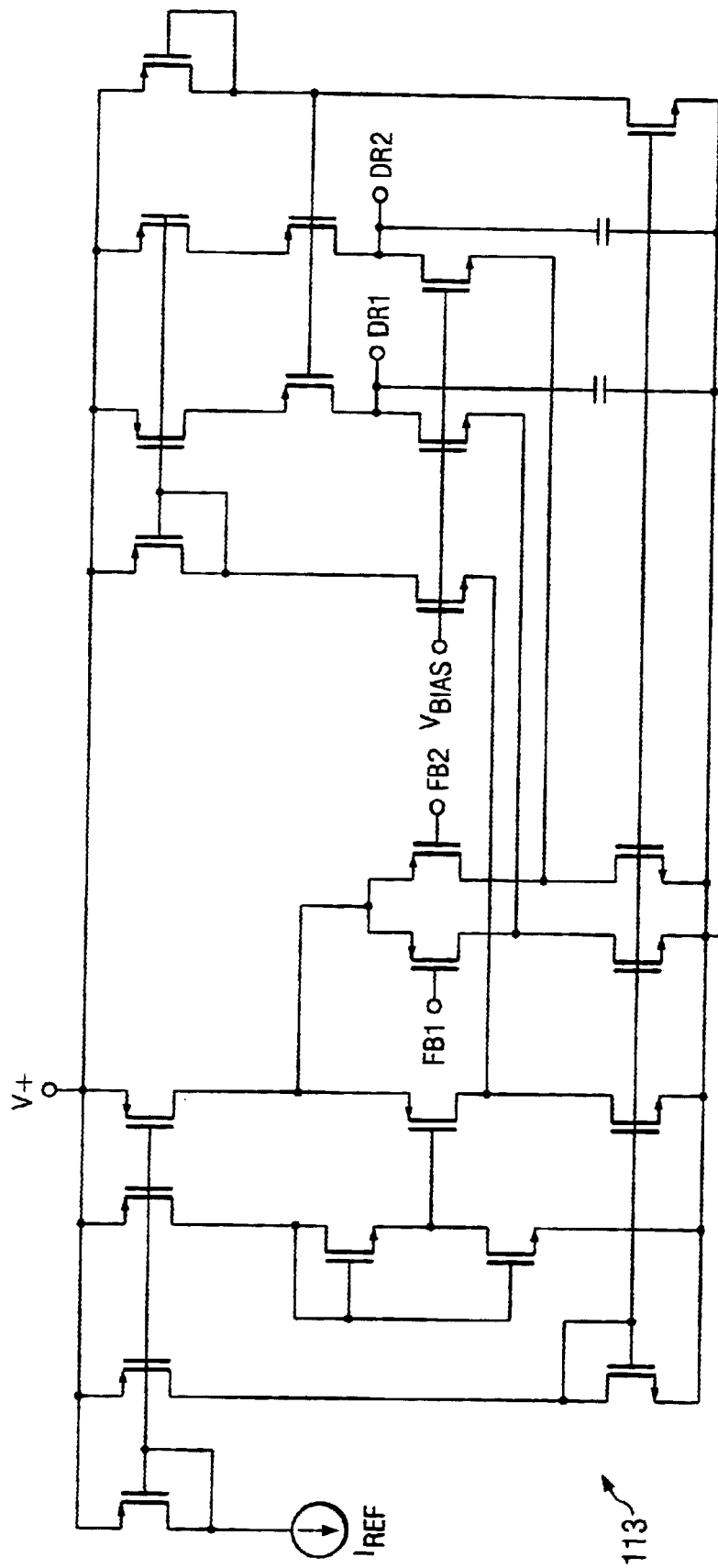
FIG. 4 is a schematic diagram of the low side gain boost amplifier 113 of FIG. 2-1.

Low side gain boost amplifier 113 of FIG. 4 is shown for completeness. However, it is very similar in both structure and operation to high side gain boost amplifier 117, and therefore is not described in detail.

The way that the auto zeroed-circuit operates is that one of the two nulling amplifiers is in the configuration shown in FIG. 1A and the other is in the configuration shown in FIG. 1B, or vice versa, wherein one nulling amplifier drives the output of the auto-zeroed amplifier when the other operates in a configuration with its inputs shorted together. The two nulling amplifiers alternately swap configurations, so there is always a continuous signal path from $V_{in}$ is applied to the output $V_{out-}$ The two nulling amplifiers therefore operate to correct their own offsets and the offset of the entire auto-zeroed amplifier.

Figure 5:
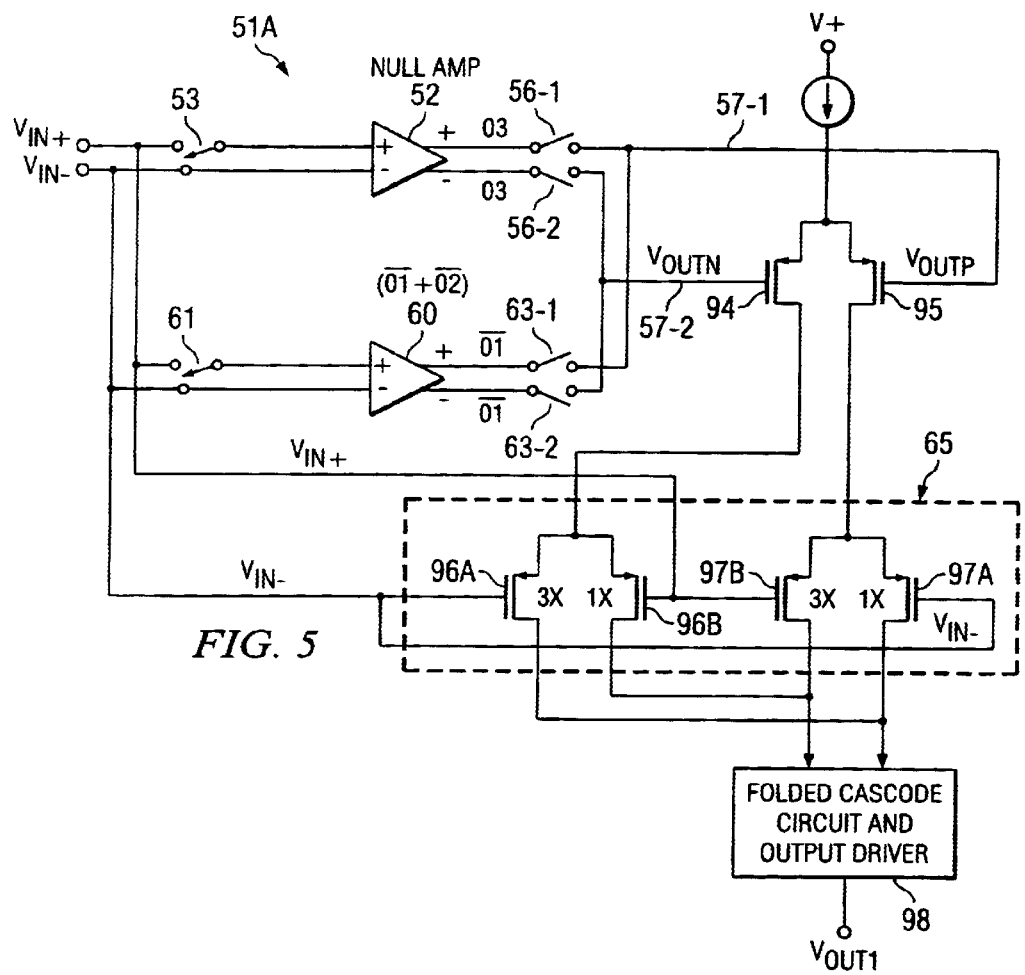
FIG. 5 is a schematic diagram of the analog summing circuit and output stage of FIG. 1A.

FIG. 5 shows a simplified practical differential implementation 51 A of the auto-zeroed amplifier 51 of FIG. 1A, wherein the hold capacitors and associated switches shown in FIG. 1A are omitted for convenience. The (+) and (−) outputs of nulling amplifier 52 are coupled by switches 56-1 and 56-2 to conductors 57-1 and 57-2, respectively. The (+) and (−) outputs of nulling amplifier 60 are connected by switches 63-1 and 63-2 to conductors 57-1 and 57-2, respectively. Switches 56-1 and 56-2 are controlled by φ3, and switches 63-1 and 63-2 a controlled by $\bar{\phi}1$. Conductor 57-1 conducts $V_{outp}$ and is connected to the gate of a P-channel transistor 95, which has its source connected to a constant tail current source. Conductor 57-2 conducts $V_{outn}$ and is connected to the gate of the P-channel transistor 94 which has its source connected to the source of transistor 95. The drain of transistor 94 is connected to the common sources of P-channel transistors 96A and 96B, wherein the channel-width-to-channel-length ratio of transistor 96A is 3 times (or any other suitable factor) that of transistor 96B. Similarly, the drain of transistor 95 is connected to the common sources of P-channel transistors 97A and 97B, wherein the channel-width-to-channel-length ratio of transistor 97B is 3 (or the other suitable factor) times that of transistor 97A. The gates of transistors 96A and 97A are connected to receive $V_{in-}$, and the gates of transistors 96B and 97B are connected to receive $V_{in+}$. The drains of "3x" transistor 96A and "1x" transistor 97A are connected to one input of "folded cascode and output driver" circuit 98, and drains of "1x"transistor 96B and "3x" transistor 97B are connected to another input of folded cascode and output driver circuit 98, the output of which is a differential or single-ended output voltage $V_{out1}$. Transistors 96A, 96B, 97A and 97B are included in feed-forward amplifier 65 of FIG. 1A, as indicated by dashed lines 65 in FIG. 5. The output driver circuit in block 98 corresponds to output stage 59 in FIG. 1A. Transistors 96A, 96B, 97A, 97B, 94 and 95 comprise the summing circuit 58 of FIG. 1A.

Transistors 94 and 95 steer the constant tail current between the transistor pair 96A,B and the transistor pair 97A,B in accordance with the magnitude and polarity of $V_{in}$. Because of the 3-to-1 imbalance in the size of transistor 96A relative to transistor 96B and the 3-to-1 imbalance in the size of transistor 97B relative to transistor 97A, the effective "input offset voltage" between the transistor pair 97A,B and the transistor pair 96A,B is adjusted in accordance with how much current is steered through each pair. This effect of $V_{in}$ as amplified by nulling amplifiers 52 and 60 is selectively combined with or added to the effect of $V_{in}$ being applied between the gates of transistors 96A and 97A and transistors 96B and 97B as shown in FIG. 5. The resulting current flowing into the two inputs of the conventional folded cascode circuitry included in block 98 results in a value of $V_{out1}$ that is effectively compensated for the input offset voltages of nulling amplifiers 52 and 60 and for the offset voltages of the input transistors 96A and 96B and the input transistors 97A and 97B.

The above described preferred embodiment of invention allows the ratio of the gm of the pair of transistors 3 and 16 to the gm of the nulling pair of transistors 18 and 19 to be increased from the previously accepted upper limit of 10 to the value of 23 without increasing the integrated circuit chip quiescent current consumption, and therefore allows a substantial reduction of the input-referred noise without substantially increasing the integrated circuit quiescent current consumption or the offset voltage of the entire auto-zeroed amplifier.

Each of nulling amplifiers has its own residual offset voltage, given by Equation 2. If the residual offset voltages of nulling amplifiers 52 and 60 are different, then the outputs of nulling amplifiers 52 and 60 will settle to 2 different voltages as switches 56 and 63 are operated to alternately connect and disconnect nulling amplifiers 52 and 60 to conductor 57 in FIG. 1A. This causes a ripple voltage component to propagate to the output $V_{out1}$. The gain boost technique provided by the present invention causes the residual offset voltages of nulling amplifiers 52 and 60 to be reduced, and thereby also reduces the foregoing ripple voltage component in $V_{out1}$.

Those skilled in the art will understand that the input-referred noise can be optimized by changing the circuit speed of the nulling loop relative to the speed of the clock signal, and that the noise can be lowered by running the clock signal faster and/or by reducing the bandwidth of the nulling loop. An advantage of the gain boost provided according to the present invention is that it allows charge injection errors, for example at switches 69A and 69B, to be smaller when they are referred back to the input. That allows a higher clock frequency to be used without introducing substantial offset voltage degradation.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention:

For example, the nulling circuit 52A can be utilized in an auto-zeroed amplifier that includes only a single nulling amplifier. In this case, feed-forward amplifier 65 is essential. In some cases, the feed-forward amplifier 65 may be omitted from the configuration of FIG. 1A wherein two nulling amplifiers are utilized. In some cases, nulling amplifier 52A might have only high side gain boost amplifier 117 or only low side gain boost amplifier 113, depending on whether "high side" or "low side" circuitry is causing the impedance at conductors 57A and 57B to be too low.

What is claimed is:

1. Nulling amplifier circuitry comprising:
   (a) a first differential stage including first and second input transistors and a first tail current source coupled to sources of the first and second input transistors, respectively, an input signal being controllably coupled between gates of the first and second input transistors;
   (b) a second differential stage including first and second nulling transistors, a second tail current source being coupled to sources of the first and second nulling transistors, a drain of the first nulling transistor being coupled to the drain of the second input transistor, a drain of the second nulling transistor being coupled to the drain of the first input transistor;
   (c) a first hold capacitor coupled between a gate of the first nulling transistor and a first reference voltage;
   (d) first and second switches for coupling the gates of the first and second nulling transistors to an output stage;
   (e) a gain circuit having an input coupled to the drains of the first and second input transistors and an output coupled to the output stage;
   (f) gain boost amplifier circuitry having a feedback input coupled to the gain circuit and an output coupled to the output stage.

2. The nulling amplifier circuitry of claim 1 wherein the first and second switches couple the gates of the first and second nulling transistors to circuitry associated with the output stage.

3. The nulling amplifier circuitry of claim 1 including a second hold capacitor coupled between a gate of the second nulling transistor and the first reference voltage.

4. The nulling amplifier circuitry of claim 1 wherein the gain boost amplifier circuitry has its feedback input coupled to an input of the gain circuit.

5. A nulling amplifier comprising:
   (a) a first differential stage including first and second input transistors and a first tail current source coupled to sources of the first and second input transistors;
   (b) a switching circuit selectively coupling a gate of the first input transistor to either a first input signal or to a gate of the second input transistor in response to a control signal, a second input signal being coupled to the gate of the second input transistor;
   (c) a second differential stage including first and second nulling transistors, a second tail current source being coupled to sources of the first and second nulling transistors, a drain of the first nulling transistor being coupled to the drain of the second input transistor, a drain of the second nulling transistor being coupled to the drain of the first input transistor;
   (d) a first hold capacitor coupled between a gate of the first nulling transistor and a first reference voltage, and a second hold capacitor coupled between a gate of the second nulling transistor and the first reference voltage;
   (e) first and second switches coupling the gates of the first and second nulling transistors to first and second output signals, respectively, in response to the control signal, the first and second output signals being coupled to an output stage;
   (f) a folded cascode circuit having an input coupled to the drains of the first and second input transistors and an output coupled to the output stage; and
   (g) gain boost amplifier circuitry having a feedback input coupled to the folded cascode circuit and an output coupled to the output of the folded cascode circuit.

6. The nulling amplifier of claim 5 wherein the switching circuit operates in response to the control signal to either couple the gate of the second input transistor to the first input signal in response to one condition of the control signal or to cause the switching circuit to couple the gate of the second input transistor to the gate of the first input transistor in response to another condition of the control signal.

7. The nulling amplifier of claim 5 wherein the folded cascode circuit includes a first constant current source transistor having a drain coupled to the drain of the second input transistor and to a source of a first cascode transistor, and a second constant current source transistor having a drain coupled to the drain of the second input transistor and to a source of a second cascode transistor, a first gain boost amplifier output transistor coupling the drain of the first constant current source transistor to the source of the first cascode transistor, and a second gain boost amplifier output transistor coupling the drain of the second constant current source transistor to the source of the second cascode transistor.

8. The nulling amplifier of claim 5 wherein the folded cascode circuit includes a first low side constant current source transistor having a drain coupled to the drain of the second input transistor and to a source of a first cascode transistor, and a second low side constant current source transistor having a drain coupled to the drain of the first input transistor and to a source of a second cascode transistor, the gain boost amplifier circuitry including a low side gain boost amplifier having a first output terminal coupled to a gate of a first gain boost amplifier output transistor coupling the drain of the first low side constant current source transistor to the source of the first cascode transistor, the low side gain boost amplifier having a second output terminal coupled to a gate of a second gain boost amplifier output transistor coupling the drain of the second low side constant current source transistor to the source of the second cascode transistor.

9. The nulling amplifier of claim 8 wherein the folded cascode circuit includes a first high side constant current source transistor having a drain coupled to a drain of the first cascode transistor, and a second high side constant current source transistor having a drain coupled to a drain of the second cascode transistor, the gain boost amplifier circuitry including a high side gain boost amplifier having a first output terminal coupled to a gate of a third gain boost amplifier output transistor coupling the drain of the first high side constant current source transistor to the drain of the first cascode transistor, the high side gain boost amplifier including a second output terminal coupled to a gate of a fourth gain boost amplifier output transistor coupling the drain of the second high side constant current source transistor to the drain of the second cascode transistor.

10. The nulling amplifier of claim 9 wherein the low side gain boost amplifier includes a first feedback input coupled to the drain of the first low side constant current source transistor and a second feedback input coupled to the drain of the second low side constant current source transistor, and wherein the high side gain boost amplifier includes a first feedback input coupled to the drain of the first high side constant current source transistor and a second feedback input coupled to the drain of the second high side constant current source transistor.

11. The nulling amplifier of claim 10 including a common mode feedback circuit coupled to the first and second switches and the first and second high side constant current source switches to produce a common mode level of the first and second output signals.

12. The nulling amplifier of claim 10 wherein the high side gain boost amplifier includes:
  i. an amplifier stage including N-channel first, second, and third transistors having sources commonly connected to a tail current source transistor and having drains connected to first, second, and third current source transistors, respectively, and reference circuitry for establishing a reference voltage on a gate of the first transistor, wherein the first feedback input of the high side gain boost amplifier is coupled to a gate of the third transistor, the second feedback input of the high side gain boost amplifier is coupled to a gate of the second transistor; and
  ii. a cascode stage including P-channel fourth, fifth, and sixth transistors having sources connected to the drains of the first, second, and third transistors, respectively, gates connected to a cascode reference voltage, a drain of the fourth transistor being coupled to a gate and drain of an N-channel seventh transistor having a source connected to a reference voltage and to gates of N-channel eighth and ninth transistors having sources connected to the reference voltage, a drain of the fifth transistor coupled to a drain of the eighth transistor and to the second output terminal of the high side gain boost amplifier, a drain of the sixth transistor being coupled to a drain of the ninth transistor and to the first output terminal of the high side gain boost amplifier.

13. The nulling amplifier of claim 10 wherein feedback from sources of the third and fourth gain boost amplifier output transistors forces voltages on the first and second feedback inputs of the high side gain boost amplifier to be nearly equal to the reference voltage on the gate of the first transistor.

14. The nulling amplifier of claim 13 wherein the high side gain boost amplifier operates to cause current flowing from the fourth transistor into the seventh transistor to be mirrored to current flowing in the eighth transistor and current flowing in the ninth transistor so as to establish an equilibrium causing high output impedances at the output of the folded cascode stage so that the transconductance of the first and second nulling transistors multiplied by an equivalent output impedance of the high side gain boost amplifier is high even though the transconductance of the nulling transistors has been reduced to minimize input-referred noise.

15. The nulling amplifier of claim 14 wherein the high side gain boost amplifier operates so that as voltages of the gates of the second and third transistors vary with respect to each other they force the voltages of the first and second output terminals of the high side gain boost amplifier to vary so as to keep the voltages of the first and second feedback inputs of the high side gain boost circuit nearly equal in order to provide high differential output impedance at the output of the folded cascode circuit.

16. The nulling amplifier of claim 14 wherein the low side gain boost amplifier operates similarly to the high side gain boost amplifier to cause high output impedances at the output of the folded cascode stage so that the transconductance of the first and second nulling transistors multiplied by an equivalent output impedance of the low side gain boost amplifier is high even though the transconductance of the output of the folded cascode stage has been reduced to minimize input-referred noise.

17. The nulling amplifier of claim 16 wherein the low side gain boost amplifier operates so as to force the voltages of the first and second output terminals of the low side gain boost amplifier to vary so as to keep the voltages of the first and second feedback inputs of the low side gain boost circuit nearly equal in order to provide high differential output impedance at the output of the folded cascode circuit.

18. The nulling amplifier of claim 5 including a third hold capacitor coupled between the gates of the first and second nulling transistors.

19. The nulling amplifier of claim 10 wherein the channel-width-to-channel-length ratios of the first and second input transistors and the first and second nulling transistors have values which establish a predetermined low input-referred noise level in the nulling amplifier.

20. The nulling amplifier of claim 19 wherein the high side gain boost amplifier and the low side gain boost amplifier have sufficiently high values of output impedance to produce a predetermined low value of gain error in the nulling amplifier.

21. An auto-zeroed amplifier circuit comprising:
   (a) a first nulling amplifier having first and second inputs coupled to receive an input signal and producing a first output signal;
   (b) an output stage producing a second output signal in response to the first output signal;
   (c) the first nulling amplifier including
      i. a first differential stage including first and second input transistors and a first tail current source coupled to sources of the first and second input transistors, the input signal being controllably coupled between gates of the first and second input transistors,
      ii. a switching circuit selectively coupling a gate of the second input transistor to either a first input signal or to a gate of the first input transistor in response to a control signal, a second input signal being coupled to the gate of the first input transistor,
      iii. a second differential stage including first and second nulling transistors, a second tail current source coupled to sources of the first and second nulling transistors, a drain of the first nulling transistor being coupled to the drain of the second input transistor, the drain of the second nulling transistor being coupled to the drain of the first input transistor,
      iv. a first hold capacitor coupled between a gate of the first nulling transistor and a first reference voltage, and a second hold capacitor coupled between a gate of the second nulling transistor and the first reference voltage,
      v. first and second switches coupling the gates of the first and second nulling transistors to the output stage,
      vi. a folded cascode circuit having an input coupled to the drains of the first and second input transistors and an output coupled to the output stage, and
      vii. gain boost amplifier circuitry having a feedback input coupled to the folded cascode circuit and an output coupled to the output stage.

22. The auto-zeroed amplifier circuit of claim 21 including a feed-forward amplifier having first and second inputs coupled to receive the input signal, and also including analog summing circuitry having a first input coupled to the output of the first nulling amplifier and a second input coupled to an output of the feed-forward amplifier.

23. The auto-zeroed amplifier circuit of claim 22 including a second nulling amplifier having first and second inputs coupled to receive the input signal and producing the first output signal part of the time, the first nulling amplifier producing the first output signal another part of the time.

24. The auto-zeroed amplifier circuit of claim 21 including a second nulling amplifier having first and second inputs coupled to receive the input signal and producing the first output signal part of the time, the first nulling amplifier producing the first output signal another part of the time.

25. A method of reducing input-referred noise in a nulling amplifier, the nulling amplifier including
   i. a first differential stage including first and second input transistors,
   ii. a switching circuit selectively coupling a gate of the second input transistor to either a first input signal or to a gate of the first input transistor in response to a control signal, a second input signal being coupled to the gate of the first input transistor,
   iii. a second differential stage including first and second nulling transistors, a drain of the first nulling transistor being coupled to the drain of the second input transistor, a drain of the second nulling transistor being coupled to the drain of the first input transistor, and
   iv. a first hold capacitor coupled to a gate of the first nulling transistor, and a second hold capacitor coupled to a gate of the second nulling transistor, the method comprising:
      (a) coupling the gates of the first and second nulling transistors to first and second conductors in response to the control signal to cause the gates of the first and second nulling transistors to first and second to receive first and second output signals, respectively, being supplied to an input port of an output stage;
      (b) coupling the drains of the first and second input transistors to an input port of a folded cascode circuit; and
      (c) operating gain boost amplifier circuitry having a feedback input coupled to the input port of the folded cascode circuit and an output port coupled to the first and second conductors to cause the gain boost amplifier circuitry to produce high output impedances at the output port of the gain boost amplifier circuitry so that the transconductance of the first and second nulling transistors multiplied by the output impedance at the output port of the gain boost amplifier circuitry is high even though the transconductance of the first and second nulling transistors has been reduced to minimize input-referred noise.

26. Circuitry for reducing input-referred noise in a nulling amplifier, comprising:
   (a) a first differential stage including first and second input transistors;
   (b) a switching circuit selectively coupling a gate of the second input transistor to either a first input signal or to a gate of the first input transistor in response to a control signal, a second input signal being coupled to the gate of the second input transistor;
   (c) a second differential stage including first and second nulling transistors, a drain of the first nulling transistor being coupled to the drain of the second input transistor, a drain of the second nulling transistor being coupled to the drain of the first input transistor;
   (d) a first hold capacitor coupled to a gate of the first nulling transistor, and a second hold capacitor coupled to a gate of the second nulling transistor;
   (e) means for coupling the gates of the first and second nulling transistors to first and second conductors in response to the control signal to receive first and second output signals coupled to an input port of an output stage;
   (f) means for coupling the drains of the first and second input transistors to an input port of a folded cascode circuit; and (g) means for operating gain boost amplifier circuitry having a feedback input coupled to the folded cascode circuit and an output port coupled to the first and second conductors to cause the gain boost amplifier circuitry to produce high output impedances at the output port of the gain boost amplifier circuitry so that the transconductance of the first and second nulling transistors multiplied by the output impedance at the output port of the gain boost amplifier circuitry is high even though the transconductance of the first and second nulling transistors has been reduced to minimize input-referred noise.

* * * * *